US012628398B2

(12) United States Patent
Yang et al.

(10) Patent No.: US 12,628,398 B2
(45) Date of Patent: May 12, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chansyun David Yang, Hsinchu (TW); Ding-Kang Shih, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 471 days.

(21) Appl. No.: 18/154,046

(22) Filed: Jan. 13, 2023

(65) Prior Publication Data

US 2024/0088234 A1 Mar. 14, 2024

Related U.S. Application Data

(60) Provisional application No. 63/374,904, filed on Sep. 8, 2022.

(51) Int. Cl.
*H10D 64/01* (2025.01)
*H01L 21/285* (2006.01)
(Continued)

(52) U.S. Cl.
CPC ....... *H10D 64/01* (2025.01); *H01L 21/28518* (2013.01); *H01L 21/28525* (2013.01);
(Continued)

(58) Field of Classification Search
CPC ............................ H10D 64/01; H10D 30/031; H01L 21/28518; H01L 21/28525
See application file for complete search history.

(56) References Cited

U.S. PATENT DOCUMENTS 9,685,439 B1 * 6/2017 Lee ......................... H10D 30/62
10,283,365 B1 * 5/2019 Smith ................ H10D 30/0275
(Continued)

FOREIGN PATENT DOCUMENTS

CN 114300363 A * 4/2022 ......... H10D 62/8325
CN 114823537 A * 7/2022 ............. B82Y 10/00
(Continued)

*Primary Examiner* — Laura M Menz
(74) *Attorney, Agent, or Firm* — WPAT LAW; Anthony King

(57) ABSTRACT

A method for manufacturing a semiconductor structure is provided. The method may include several operations. A substrate is provided, received or formed, wherein the substrate includes an epitaxial structure in a fin structure of the substrate and a metal gate structure over the fin structure. An insulating layer covering the metal gate structure is formed. A semiconductive material layer is formed over the epitaxial structure and the insulating layer, wherein a first portion of the semiconductive material layer over the epitaxial structure comprises crystalline semiconductive material, and a second portion of the semiconductive material layer over the insulating layer comprises amorphous semiconductive material. The second portion of the semiconductive material layer is removed. A semiconductor structure thereof is also provided.

20 Claims, 15 Drawing Sheets

(51) Int. Cl.

| | |
|---|---|
| *H10D 30/01* | (2025.01) |
| *H10D 30/43* | (2025.01) |
| *H10D 30/67* | (2025.01) |
| *H10D 62/13* | (2025.01) |

(52) U.S. Cl.
CPC .......... *H10D 30/031* (2025.01); *H10D 30/43* (2025.01); *H10D 30/6729* (2025.01); *H10D 30/6735* (2025.01); *H10D 30/6737* (2025.01); *H10D 30/6743* (2025.01); *H10D 62/151* (2025.01); *H10D 64/015* (2025.01); *H10D 64/021* (2025.01)

(56) References Cited

U.S. PATENT DOCUMENTS

| | | | | |
|---|---|---|---|---|
| 10,861,952 B2 * | 12/2020 | Ching | ................. | H10D 84/853 |
| 10,872,893 B2 * | 12/2020 | Yang | ................... | H10D 84/038 |
| 11,007,005 B2 * | 5/2021 | Lee | ..................... | H10D 84/834 |
| 11,476,342 B1 * | 10/2022 | Lee | ................... | H10D 84/0193 |
| 11,688,625 B2 * | 6/2023 | Hsiao | ................... | H10D 30/43 |
| | | | | 438/478 |
| 11,929,409 B2 * | 3/2024 | Lee | ..................... | H10D 84/038 |
| 11,990,511 B2 * | 5/2024 | Kuo | ................... | H10D 30/6211 |
| 12,094,757 B2 * | 9/2024 | Hsiao | ................ | H10D 30/6735 |
| 12,119,387 B2 * | 10/2024 | Dewey | .............. | H10D 30/6757 |
| 12,191,393 B2 * | 1/2025 | Lin | .................. | H01L 21/02639 |
| 12,230,692 B2 * | 2/2025 | Hung | .............. | H10D 30/6757 |
| 12,349,426 B2 * | 7/2025 | Kuo | ................... | H10D 84/038 |
| 2013/0270560 A1 * | 10/2013 | Cheng | ................. | H10D 30/024 |
| | | | | 257/66 |
| 2013/0270561 A1 * | 10/2013 | Cheng | ................. | H10D 30/024 |
| | | | | 257/66 |
| 2014/0213048 A1 * | 7/2014 | Sun | ...................... | H01L 21/324 |
| | | | | 438/592 |
| 2014/0332900 A1 * | 11/2014 | Basu | ................. | H10D 30/0245 |
| | | | | 438/285 |
| 2015/0270342 A1 * | 9/2015 | Tsai | ...................... | H10D 30/62 |
| | | | | 438/283 |
| 2016/0087063 A1 * | 3/2016 | Yin | ..................... | H10D 30/024 |
| | | | | 438/283 |
| 2016/0190325 A1 * | 6/2016 | Liu | .................. | H01L 21/76816 |
| | | | | 257/770 |
| 2016/0204111 A1 * | 7/2016 | Park | ...................... | H10D 30/63 |
| | | | | 257/334 |
| 2017/0154979 A1 * | 6/2017 | Lo | ...................... | H10D 30/6212 |
| 2017/0317205 A1 * | 11/2017 | Lee | ................... | H10D 30/6219 |
| 2018/0247929 A1 * | 8/2018 | Shrivastava | ....... | H10D 30/6211 |

| | | | | |
|---|---|---|---|---|
| 2019/0115426 A1 * | 4/2019 | Wong | ................. | H10D 84/0151 |
| 2020/0006159 A1 * | 1/2020 | Shih | ................. | H01L 21/02532 |
| 2020/0126988 A1 * | 4/2020 | Yang | ................. | H10D 84/0193 |
| 2021/0020522 A1 * | 1/2021 | Shih | ................. | H10D 84/0158 |
| 2022/0059677 A1 * | 2/2022 | Xie | ...................... | H10D 62/151 |
| 2022/0102521 A1 * | 3/2022 | Dewey | .................. | H10D 30/43 |
| 2022/0344516 A1 * | 10/2022 | Lin | .................... | H01L 21/0262 |
| 2022/0359682 A1 * | 11/2022 | Lee | ..................... | H10D 84/853 |
| 2022/0384243 A1 * | 12/2022 | Su | ...................... | H01L 21/7682 |
| 2023/0008413 A1 * | 1/2023 | Ho | .................... | H01L 21/02532 |
| 2023/0040843 A1 * | 2/2023 | Lung | ................. | H10D 84/0133 |
| 2023/0042480 A1 * | 2/2023 | Lee | ................... | H10D 30/6219 |
| 2023/0068434 A1 * | 3/2023 | Kuo | ................... | H10D 30/6211 |
| 2023/0068951 A1 * | 3/2023 | Hsiao | ................... | H10D 30/024 |
| 2023/0231014 A1 * | 7/2023 | Lee | ...................... | H10D 62/118 |
| 2023/0261069 A1 * | 8/2023 | Chou | .................. | H10D 84/038 |
| 2023/0274972 A1 * | 8/2023 | Hsiao | ................. | H10D 30/024 |
| | | | | 438/478 |
| 2023/0275143 A1 * | 8/2023 | Lee | .................... | H10D 30/6735 |
| | | | | 257/288 |
| 2023/0352559 A1 * | 11/2023 | Shen | ................. | H01L 21/32137 |
| 2023/0387253 A1 * | 11/2023 | Hung | ................. | H01L 21/0217 |
| 2023/0387316 A1 * | 11/2023 | Liang | ................. | H10D 64/256 |
| 2024/0088234 A1 * | 3/2024 | Yang | ................. | H10D 30/6737 |
| 2024/0120381 A1 * | 4/2024 | Shih | ................. | H10D 30/6735 |
| 2024/0120407 A1 * | 4/2024 | Fulford | ............... | H01L 21/2236 |
| 2024/0186388 A1 * | 6/2024 | Lee | ................... | H10D 84/0193 |
| 2024/0266398 A1 * | 8/2024 | Kuo | ...................... | H10D 84/013 |
| 2024/0282569 A1 * | 8/2024 | Lo | ..................... | H01L 21/02068 |
| 2024/0363354 A1 * | 10/2024 | Ren | ...................... | H10D 64/01 |
| 2025/0089295 A1 * | 3/2025 | Lin | ................... | H01L 21/02529 |
| 2025/0113517 A1 * | 4/2025 | Wang | ................. | H10D 30/025 |

FOREIGN PATENT DOCUMENTS

| | | | | | |
|---|---|---|---|---|---|
| CN | 114975437 A | * | 8/2022 | ....... | H01L 21/02639 |
| CN | 115084222 A | * | 9/2022 | ............ | H10D 84/85 |
| CN | 115241128 A | * | 10/2022 | ....... | H01L 21/76828 |
| CN | 115440792 A | * | 12/2022 | .......... | H10D 30/024 |
| CN | 115483276 A | * | 12/2022 | .......... | H10D 84/832 |
| CN | 118486652 A | * | 8/2024 | .......... | H10D 84/834 |
| CN | 120302696 A | * | 7/2025 | .......... | H10D 62/822 |
| DE | 102017119141 A1 | * | 1/2019 | ........ | H10D 30/6215 |
| DE | 102018103075 A1 | * | 2/2019 | ............ | B82Y 10/00 |
| DE | 102021121941 A1 | * | 3/2022 | .......... | H10D 64/017 |
| DE | 102022108988 A1 | * | 2/2023 | .......... | H10D 84/832 |
| KR | 20160134440 A | * | 11/2016 | ........ | H10D 84/0193 |
| KR | 20250048637 A | * | 4/2025 | .......... | H10D 62/121 |
| WO | WO-2018039645 A1 | * | 3/2018 | ........ | H10D 30/6211 |

* cited by examiner

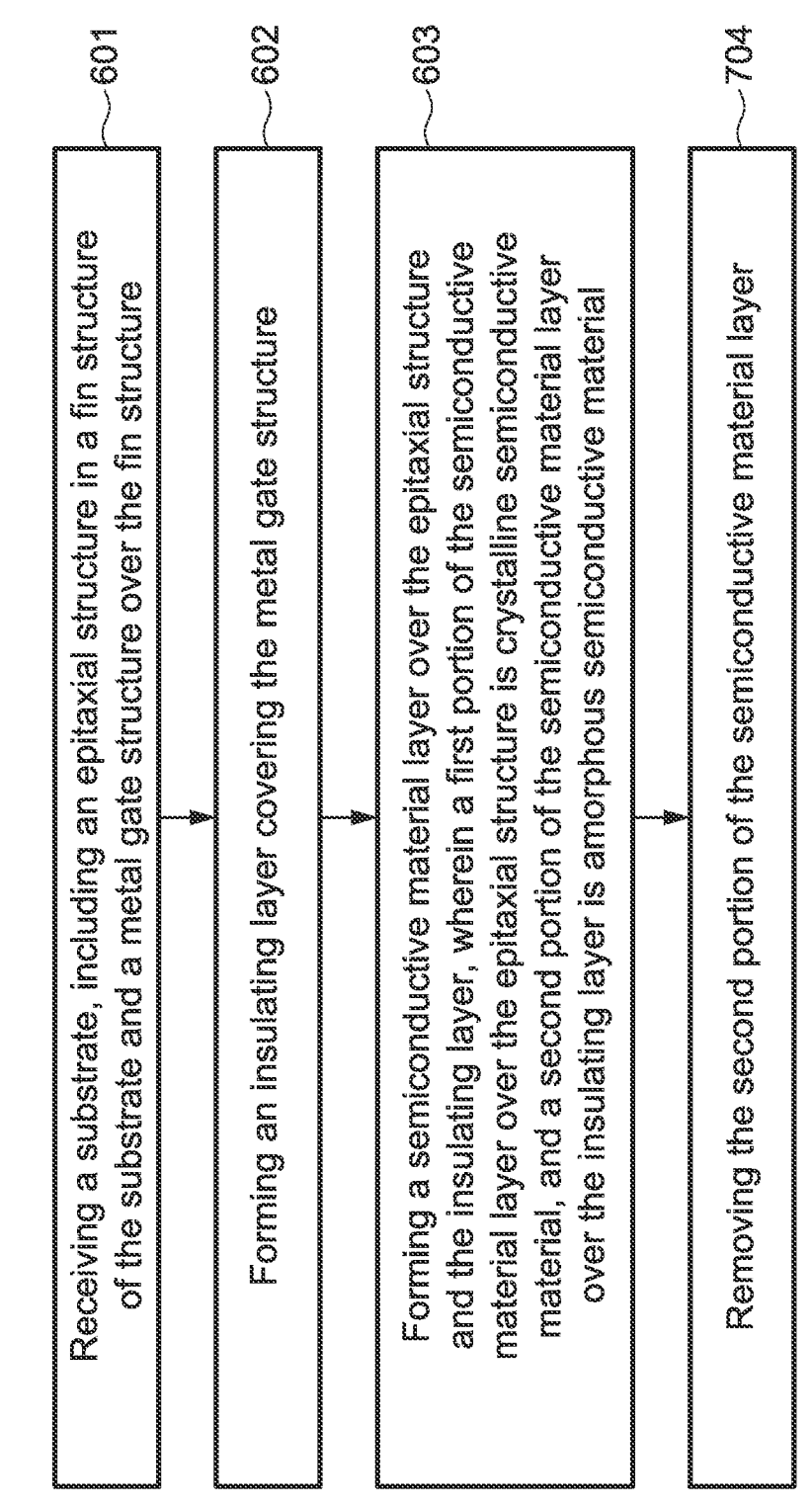

600

601 Receiving a substrate, including an epitaxial structure in a fin structure of the substrate and a metal gate structure over the fin structure 602 Forming an insulating layer covering the metal gate structure 603 Forming a semiconductive material layer over the epitaxial structure and the insulating layer, wherein a first portion of the semiconductive material layer over the epitaxial structure is crystalline semiconductive material, and a second portion of the semiconductive material layer over the insulating layer is amorphous semiconductive material 704 Removing the second portion of the semiconductive material layer

FIG. 1

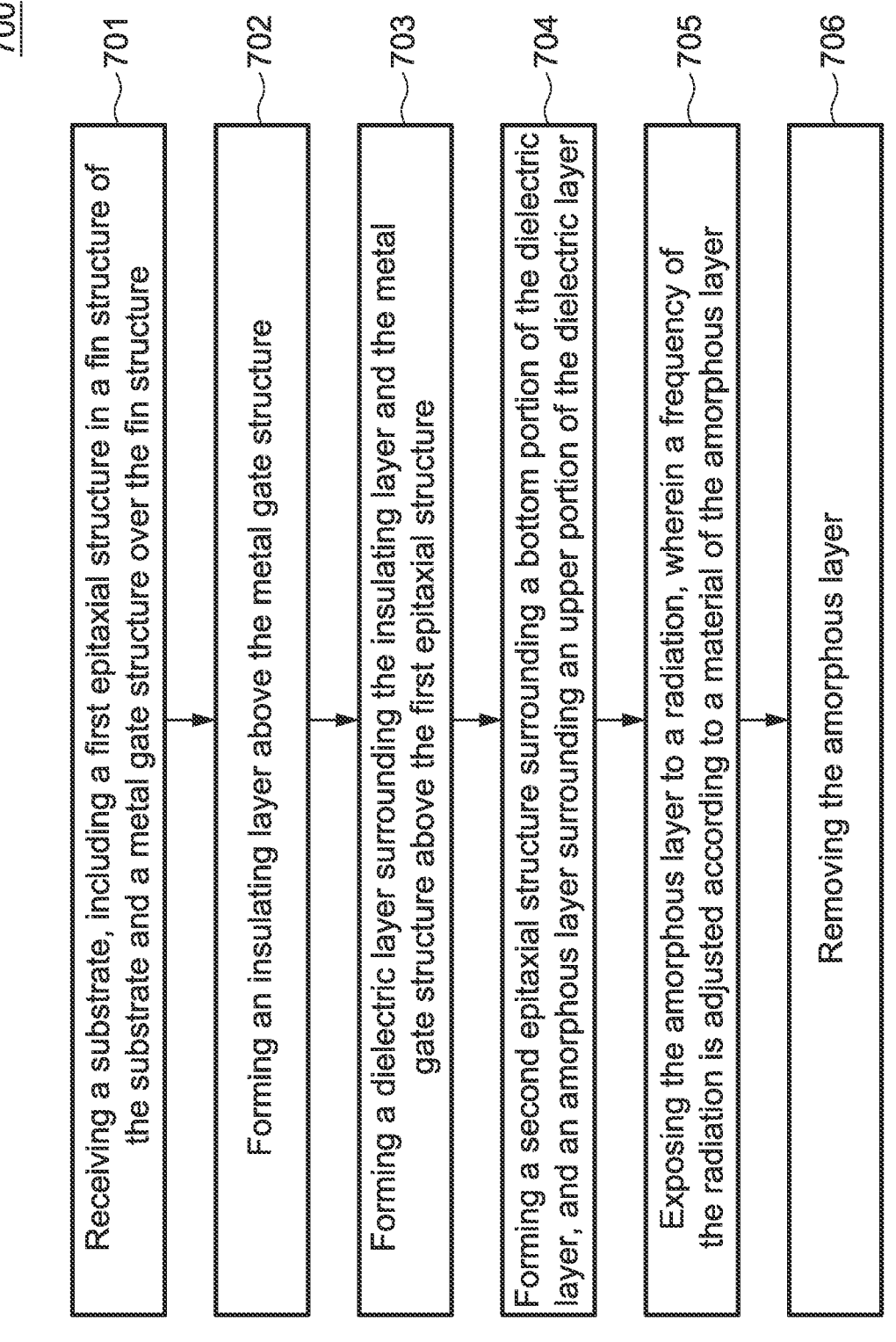

700

701 Receiving a substrate, including a first epitaxial structure in a fin structure of the substrate and a metal gate structure over the fin structure 702 Forming an insulating layer above the metal gate structure 703 Forming a dielectric layer surrounding the insulating layer and the metal gate structure above the first epitaxial structure 704 Forming a second epitaxial structure surrounding a bottom portion of the dielectric layer, and an amorphous layer surrounding an upper portion of the dielectric layer 705 Exposing the amorphous layer to a radiation, wherein a frequency of the radiation is adjusted according to a material of the amorphous layer 706 Removing the amorphous layer

FIG. 2

100
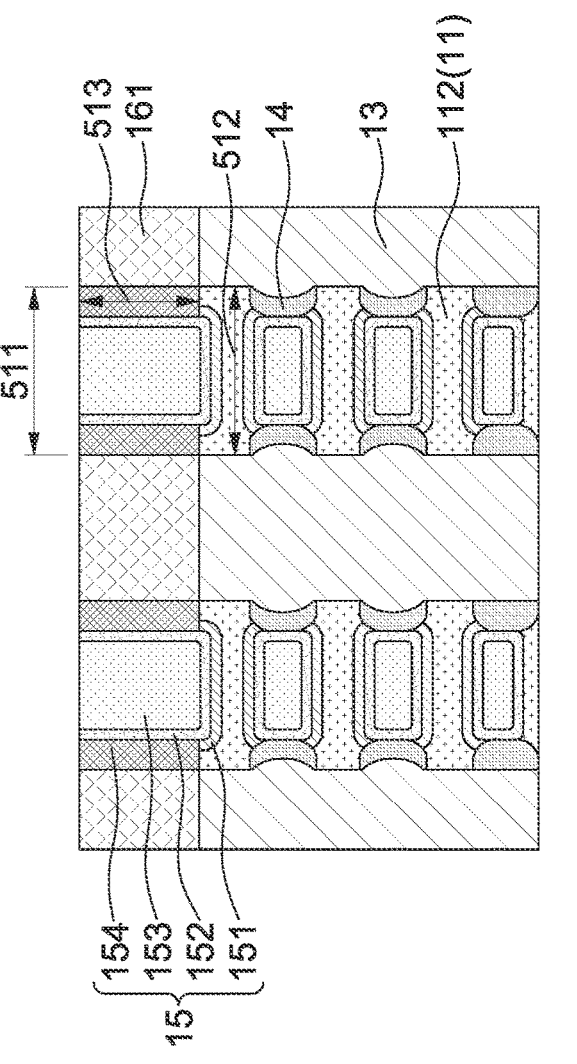
FIG. 4
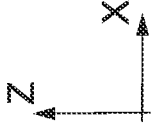

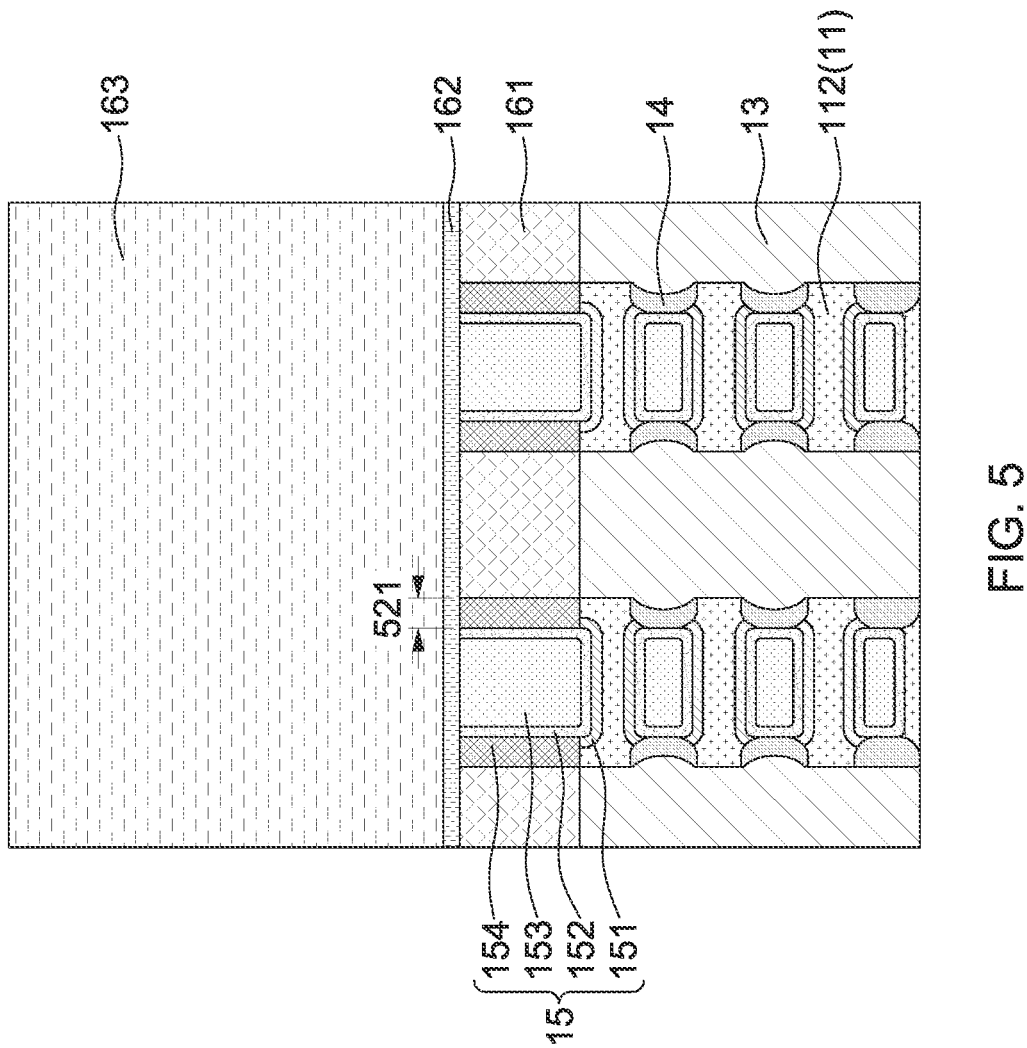
163
162
161
14
13
112(11)
521
154
153
152
151
15
FIG. 5
Z
X

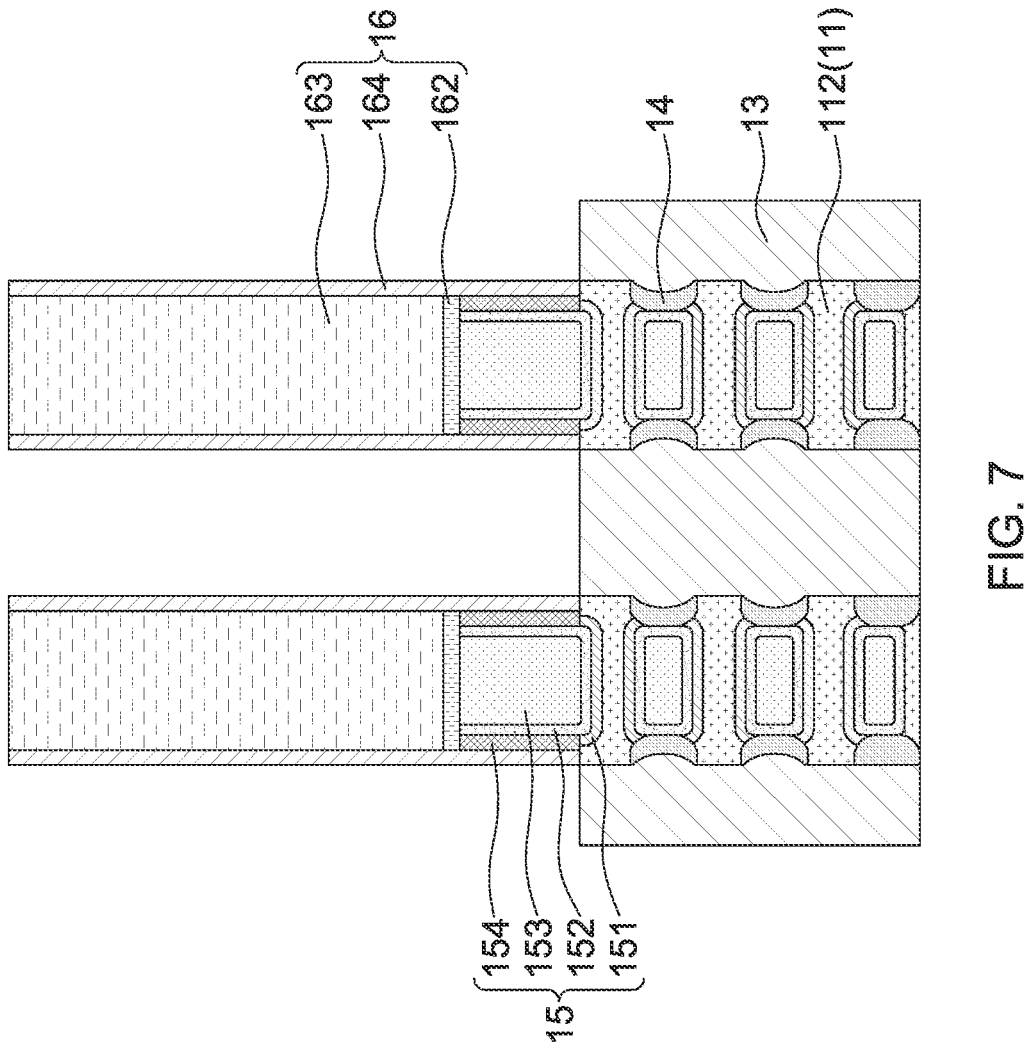
163
164  16
162
14
13
112(11)
154
153   15
152
151
FIG. 7
Z
X

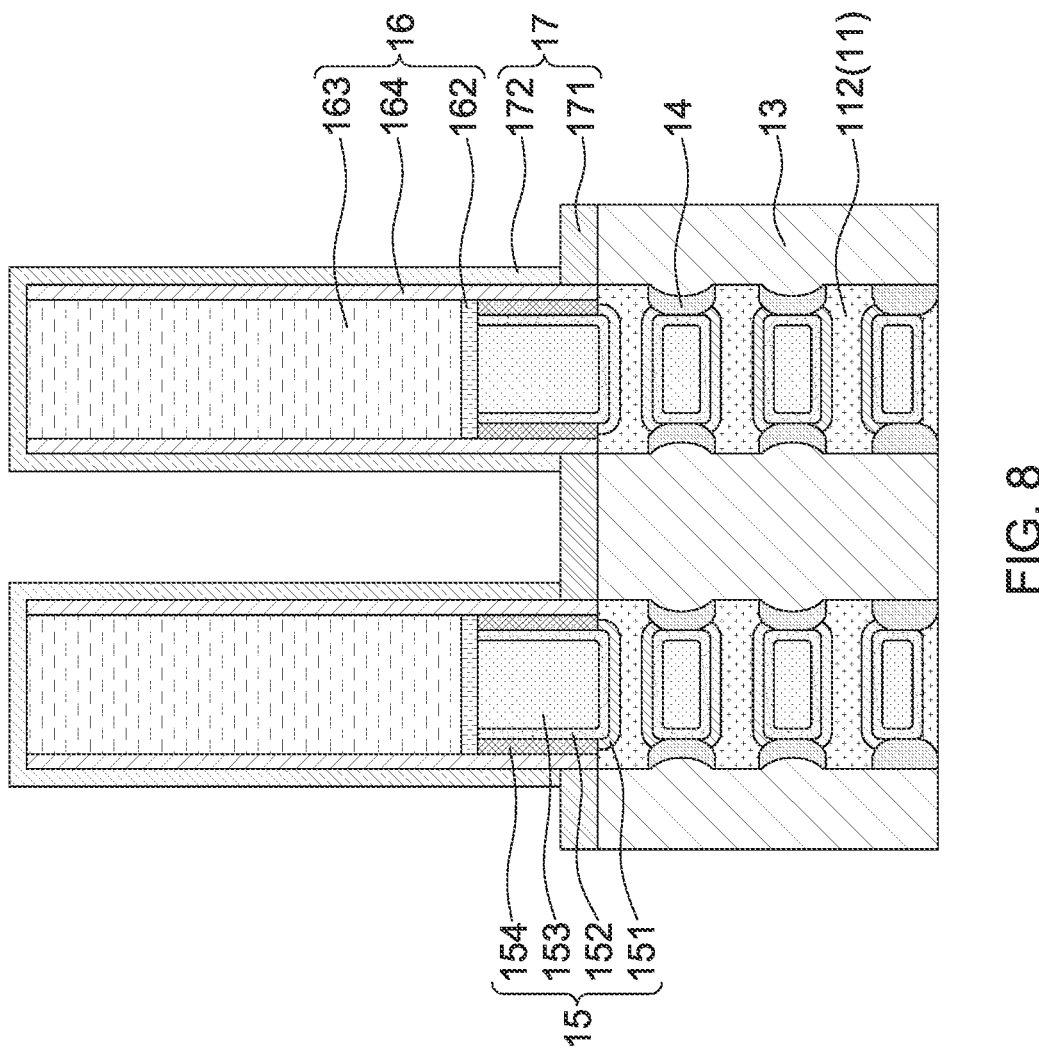
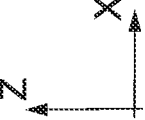
FIG. 8

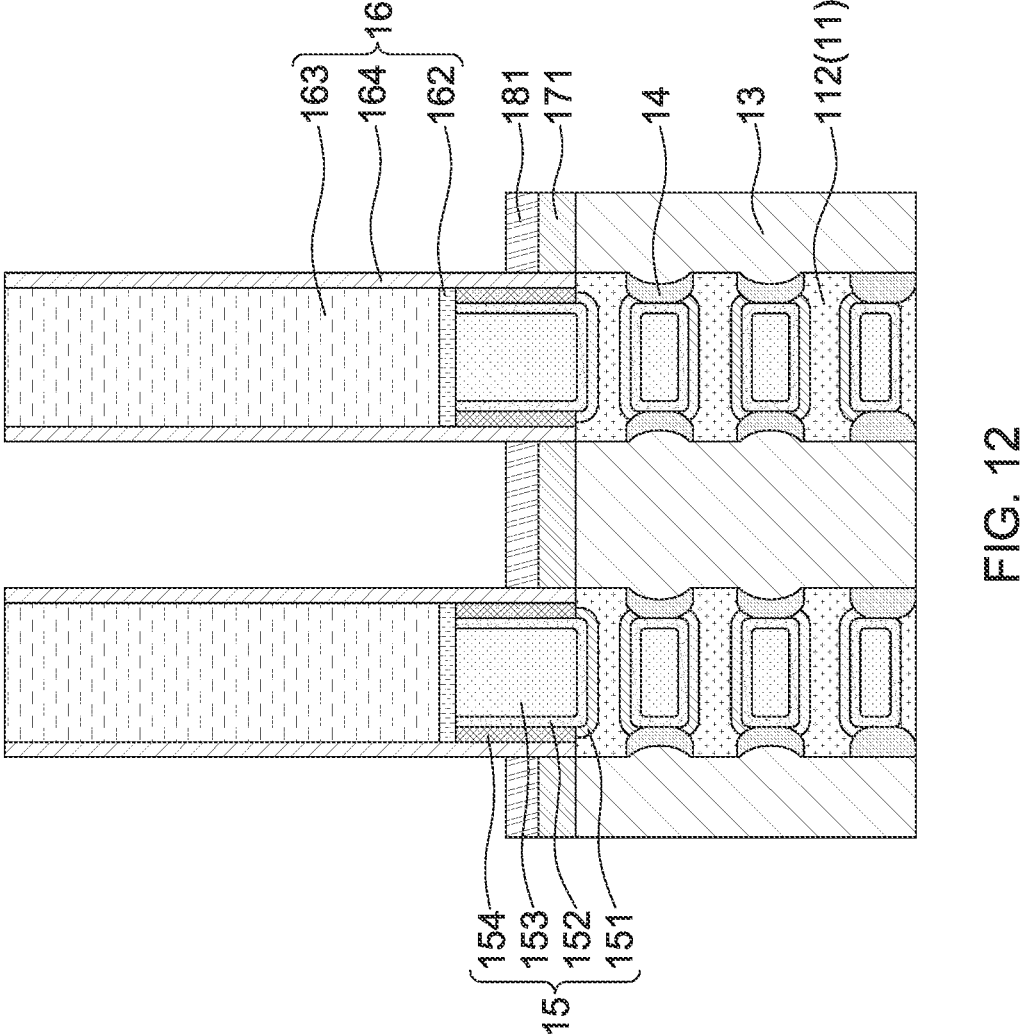
FIG. 12

200

182
163
164 } 16
162
181
171
14
13
112(11)

154
153
152 } 15
151

X
Z

SEMICONDUCTOR STRUCTURE AND METHOD OF MANUFACTURING THE SAME

PRIORITY CLAIM AND CROSS-REFERENCE

This application claims the benefit of prior-filed provisional application No. 63/374,904, filed on 8 Sep. 2022.

BACKGROUND

Transistors typically include semiconductor regions that are used to form source regions and drain regions. Within the transistors, high contact resistances tend to exist between metal contact plugs and the semiconductor regions. To reduce the contact resistance, metal silicides are formed on surfaces of the semiconductor regions to create, for example, silicon regions, germanium regions, and silicon germanium regions. As a result, the contact plugs contact the silicide regions, thus reducing the contact resistances between semiconductor regions and the contact plugs. However, as the continuing reduction in device size and increasingly complex circuit arrangements continue to make design and fabrication of integrated circuits (ICs) more challenging and costly, the usage of metal silicides cannot by itself increase device performance to a satisfactory degree. Therefore, there is a need to further reduce the contact resistance.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIG. 1 is a flow diagram of a method for manufacturing a semiconductor structure in accordance with some embodiments of the present disclosure.

FIG. 2 is a flow diagram of a method for manufacturing a semiconductor structure in accordance with some embodiments of the present disclosure.

FIGS. 4 to 13 are schematic cross-sectional diagrams of the semiconductor structure taken along a line A-A' in FIG. 3 at different stages of manufacture in accordance with some embodiments of the present disclosure.

DETAILED DESCRIPTION

Figure 3:
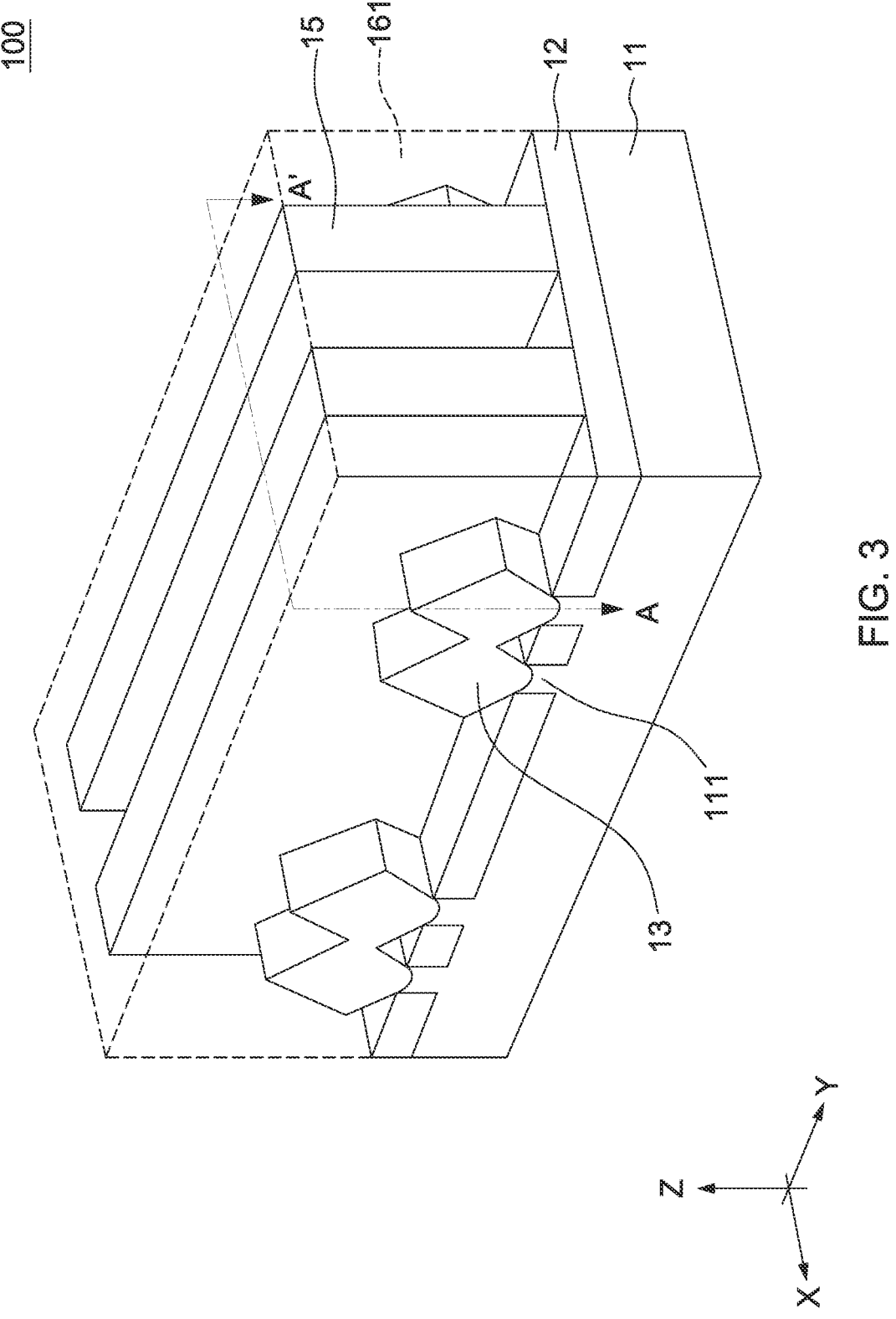
FIG. 3 is a schematic three-dimensional diagram of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a flow diagram of a method 600 for manufacturing a semiconductor structure in accordance with some embodiments of the present disclosure. The method 600 includes a number of operations (601, 602, 603 and 604) and the description and illustration are not deemed as a limitation to the sequence of the operations. In the operation 601, a substrate is received, provided or formed, wherein the substrate includes an epitaxial structure in a fin structure of the substrate and a metal gate structure over the fin structure. In the operation 602, an insulating layer covering the metal gate structure is formed. In the operation 603, a semiconductive material layer is formed over the epitaxial structure and the insulating layer, wherein a first portion of the semiconductive material layer over the epitaxial structure is crystalline semiconductive material, and a second portion of the semiconductive material layer over the insulating layer is amorphous semiconductive material. In the operation 604, the second portion of the semiconductive material layer is removed.

FIG. 2 is a flow diagram of a method 700 for manufacturing a semiconductor structure in accordance with some embodiments of the present disclosure. The method 700 includes a number of operations (701, 702, 703, 704, 705 and 706) and the description and illustration are not deemed as a limitation to the sequence of the operations. In the operation 701, a substrate, including a first epitaxial structure in a fin structure of the substrate and a metal gate structure over the fin structure, is received, provided or formed. In the operation 702, an insulating layer is formed above the metal gate structure. In the operation 703, a dielectric layer is formed surrounding the insulating layer and the metal gate structure above the first epitaxial structure. In the operation 704, a second epitaxial structure is formed surrounding a bottom portion of the dielectric layer, and an amorphous layer is formed surrounding an upper portion of the dielectric layer. In the operation 705, the amorphous layer is exposed to a radiation, wherein a frequency of the radiation is adjusted according to a material of the amorphous layer. In the operation 706, the amorphous layer is removed.

It should be noted that the operations of the method 600 and/or the method 700 may be rearranged or otherwise modified within the scope of the various aspects. Additional processes may be provided before, during, and after the method 600 and/or the method 700, and some other processes may be only briefly described herein. Thus, other implementations are possible within the scope of the various aspects described herein. In order to further illustrate concepts of the present disclosure, various embodiments are provided below.

FIG. 3 is a schematic three-dimensional diagram of a semiconductor structure 100 at a stage of the method 600 and/or a stage of the method 700 in accordance with some embodiments of the present disclosure. In the operation 601 and/or the operation 701, the semiconductor structure 100 (or referred to as a substrate 100) is formed, received, or provided. In some embodiments, the semiconductor structure 100 is referred to as an incoming substrate for the following processing illustrated in FIG. 1 and/or FIG. 2. In some embodiments, the semiconductor structure 100 includes a substrate layer 11, a plurality of fin structures 111 formed over the substrate layer 111, an isolation 12, a plurality of source/drain structures 13, a plurality of gate structures 15, and a dielectric layer 161.

In some embodiments, the substrate layer 11 includes a bulk semiconductor material, such as silicon. The substrate layer 11 may be of a first conductivity type, e.g., a P-type semiconductive substrate (acceptor type), or a second conductivity type, e.g., an N-type semiconductive substrate (donor type). Alternatively, the substrate layer 11 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiments, the substrate layer 11 includes a semiconductor-on-insulator (SOI). In some embodiments, the substrate layer 11 includes a doped epitaxial layer, a gradient semiconductor layer, a semiconductor layer overlaying another semiconductor layer of a different type, such as a silicon layer on a silicon germanium layer, or a combination thereof.

In some embodiments, the fin structures 111 are formed by removing portions of the substrate layer 11. In some embodiments, the fin structures 111 are parts of the substrate layer 11. In some embodiments, the isolation 12 is formed between adjacent fin structures 111 over the substrate layer 11. In some embodiments, the isolation 12 includes one or more dielectric materials. In some embodiments, the dielectric material includes oxide, nitride, oxynitride, a low-k dielectric material, a high-k dielectric material, or a combination thereof.

The source/drain structures 13 can be formed by epitaxial growth, and the source/drain structures 13 comprise crystalline semiconductive material. In some embodiments, the source/drain structures 13 are formed at a temperature in a range of 600 to 1000 degrees Celsius (° C.). In some embodiments, the source/drain structures 13 are formed prior to formation of the gate structures 15. In some embodiments, the source/drain structures 13 are formed with a chemical doping concentration in a range of 1E21 to 3E21 atoms/cm$^3$. In some embodiments, the source/drain structures 13 are disposed between the gate structures 15. In some embodiments, the source/drain structures 13 and the gate structures 15 are alternately arranged. In some embodiments, the source/drain structures 13 include germanium (Ge), silicon germanium (SiGe), silicon carbide (SiC), silicon phosphorus (SiP), silicon germanium carbon (SiGeC), silicon carbon phosphorus (SiCP) or other suitable materials. The source/drain structures 13 can include N-type conductivity, P-type conductivity, or a combination thereof according to a conductivity type (or types) of transistors that are to be subsequently formed. For a purpose of illustration, the source/drain structures 13 having N-type conductivity are used in the following description as an exemplary illustration. However, such description is not intended to limit the present disclosure.

The gate structures 15 can be metal gate structures. In some embodiments, the gate structures 15 are formed by a metal gate replacement of a sacrificial material. In some embodiments, the dielectric layer 161 is formed over the substrate layer 11 and surrounds the gate structures 15. In some embodiments, a top surface of the dielectric layer 161 is substantially aligned with a top surface of the gate structure 15, e.g., by a planarization or an etching-back operation.

FIG. 4 is a schematic cross-sectional diagram of the semiconductor structure 100 along a line A-A' in accordance with some embodiments of the present disclosure. FIGS. 5 to 13 are schematic cross-sectional diagrams of the semiconductor structure 100 along a line A-A' at different stages of the method 600 and/or the method 700 in accordance with some embodiments of the present disclosure. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

Referring to FIG. 4, a plurality of nanosheet structures 112 are disposed between the source/drain structures 13 and surrounded by the gate structures 15. In some embodiments, the nanosheet structures 112 are formed from portions of the fin structures 111. In some embodiments, the semiconductor structure 100 further includes a plurality of inner spacers 14 disposed between the gate structures 15 and the adjacent source/drain structures 13. In some embodiments, the gate structures 15 are separated from the source/drain structures 13 by the inner spacers 14. In some embodiments, the inner spacers 14 are disposed between adjacent nanosheet structures 112 arranged along a vertical direction (e.g., Z direction). In some embodiments, each of the gate structures 15 shown in FIG. 3 includes a low-k dielectric layer 151, a high-k dielectric layer 152, and a metallic material layer 153. In some embodiments, the low-k dielectric layer 151 surrounds the nanosheet structures 112. In some embodiments, the low-k dielectric layer 151 is formed only of a semiconductive material. In some embodiments, the high-k dielectric layer 152 surrounds the low-k dielectric layer 151. In some embodiments, the metallic material layer 153 surrounds the high-k dielectric layer 152.

In some embodiments, each of the gate structures 15 further includes a pair of spacers 154 surrounding a portion of the metallic material layer 153 disposed above the nanosheet structures 111. In some embodiments, the spacers 154 are in physical contact with a portion of the high-k dielectric layer 152 above the nanosheet structures 111. In some embodiments, a top surface of the source/drain structure 13 is substantially aligned with a top of an adjacent nanosheet structure 111. In some embodiments, the spacers 154, the portion of the high-k dielectric layer 152 and the portion of the metallic material layer 153 cover an entirety of the nanosheet structures 111. In some embodiments, a width 511 of the gate structure 15 is substantially equal to a width 512 of the nanosheet structure 111 as measured in a first direction (e.g., X direction). In some embodiments, a height 513 of a portion of the gate structure 15 above the nanosheet structures 112 is in a range of 15 to 40 nm. A conventional method of forming a gate-all-around (GAA) transistor can be applied, and details of a forming method of the semiconductor structure 100 are omitted herein. In addition, it should be noted that a structure of a nanosheet transistor is used in the figures and description for a purpose of illustration only, but is not intended to limit the present invention. The following operations of the method 600 and/or the method 700 of the invention can be applied to other types of transistors (e.g., a fin field-effect transistor (FinFET), a vertical transistor, or a nanowire transistor).

Referring to FIG. 5, a capping layer 162 and a dielectric layer 163 are sequentially formed over the gate structures 15 and the dielectric layer 161 in the operation 602 and/or the operation 702. In some embodiments, the capping layer 162 includes a dielectric material different from that of the dielectric layer 161 and/or that of the dielectric layer 163. Materials of the dielectric layer 161 and the dielectric layer 163 can be same or different depending on different applications. In some embodiments, depositions of different materials (e.g., materials of the capping layer 162 and the dielectric layer 163) are sequentially performed over the intermediate structure shown in FIG. 4. In some embodiments, the capping layer 162 covers an entirety of the gate structures 15.

Figure 6:
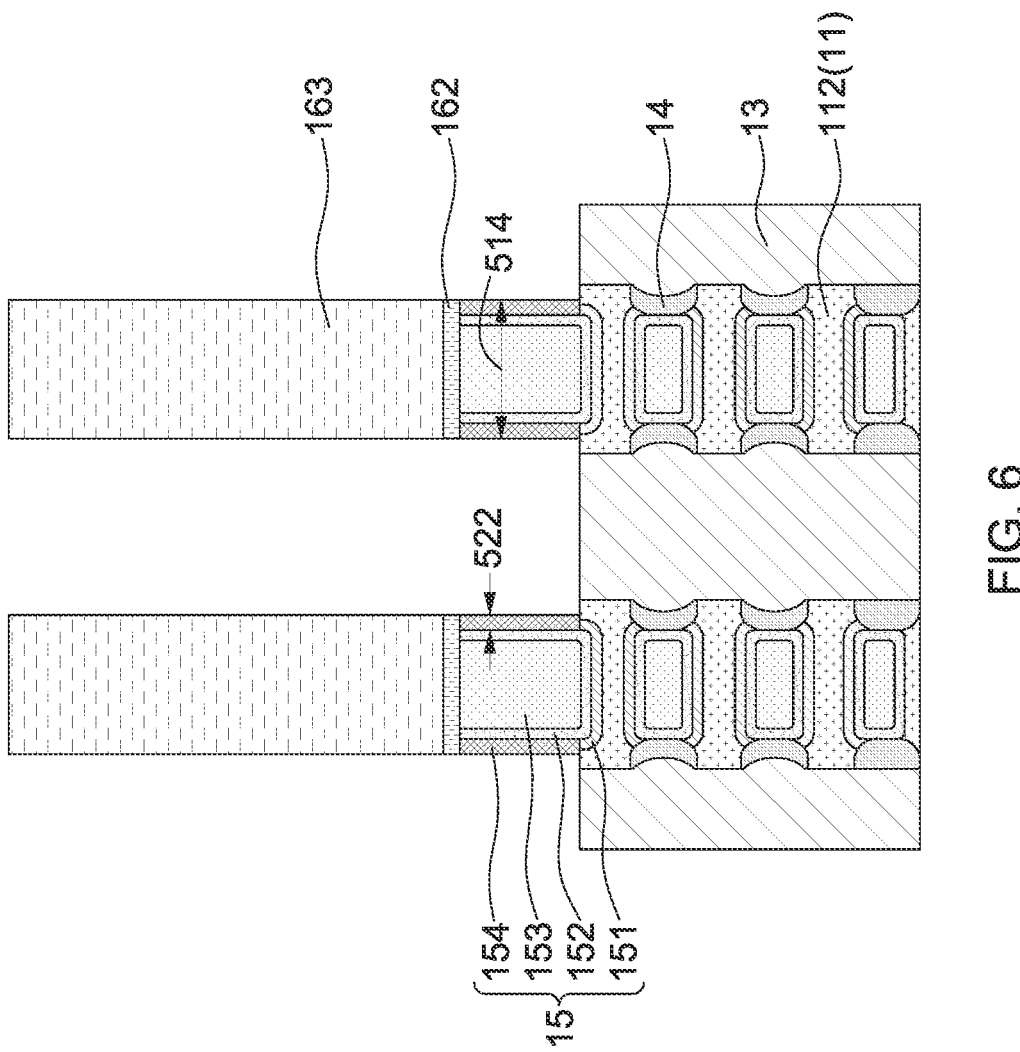

Referring to FIG. 6, the source/drain structures 13 are exposed. In some embodiments, portions of the dielectric layer 161, the capping layer 162 and the dielectric layer 163 are removed, e.g., by an etching operation. In some embodiments, portions of the dielectric layer 161, the capping layer 163 and the dielectric layer 163 that are vertically over the source/drain structures 13 are removed. In some embodiments, at least a portion of a top surface of each of the source/drain structures 13 is exposed. In some embodiments, an entirety of the top surfaces of the source/drain structures 13 are exposed. Portions of the spacers 154 may be also removed by the etching operation to expose the source/drain structures 13. In some embodiments, a width of a spacer 154 along the first direction is reduced. For example, the spacer 154 includes a width 521 prior to the etching operation shown in FIG. 5 and a width 522 shown in FIG. 6 after the etching operation, wherein the width 521 is substantially greater than the width 522. As a result, a width 514 of the gate structure 15 after the etching operation, shown in FIG. 6, is less than the width 511 before the etching operation, shown in FIG. 4. In some embodiments, the capping layer 162 and the dielectric layer 163 are collectively referred to as a mask layer surrounding or covering the gate structures 15.

Figure 15:
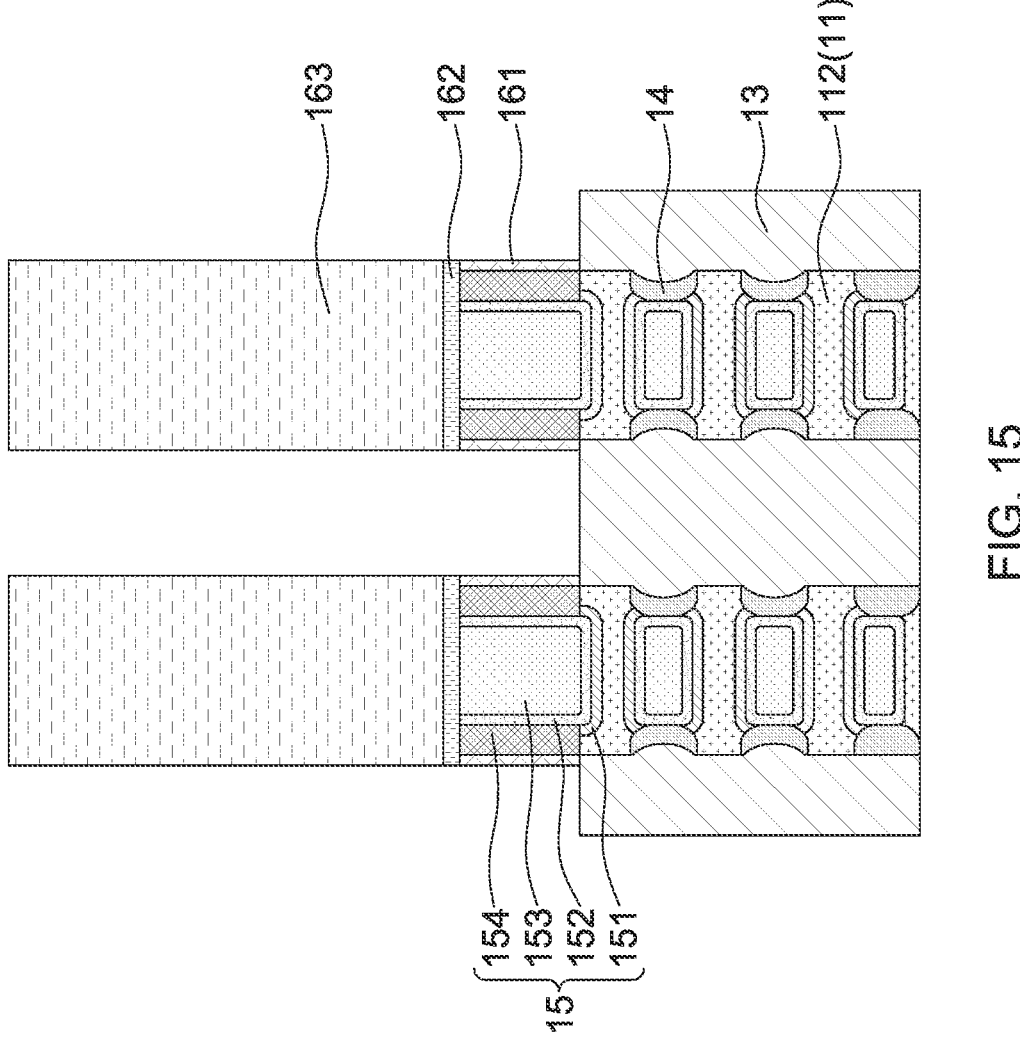
FIG. 15 is a schematic cross-sectional diagram of a semiconductor structure in accordance with some embodiments of the present disclosure.

In alternative embodiments, after the etching operation, portions of the dielectric layer 161 remain on lateral sides of the spacers 154 as shown in FIG. 15. In some embodiments, only a portion of a top surface of at least one of the source/drain structures 13 is exposed. In some embodiments, after the etching operation, a peripheral region of a source/drain structure 13 remains covered by the dielectric layer 161. In some embodiments, a width 514 of the gate structure 15 after the etching operation remains equal to the width 511 shown in FIG. 4. In some embodiments, the capping layer 162 and the dielectric layer 163 and remaining portions of the dielectric layer 161 are collectively referred to as a mask layer surrounding or covering the gate structures 15.

Referring to FIG. 7, a spacer layer 164 is formed in the operation 703. In some embodiments, the spacer layer 164 surrounds portions of the dielectric layer 163, portions of the capping layers 162 and portions of the gate structures 15 above the source/drain structures 13. In some embodiments, the spacer layer 164 is formed by a deposition followed by a spacer etching operation. The spacer layer 164 can be a single-layer structure or a multi-layer structure (e.g., oxide-nitride-oxide or nitride-oxide-nitride structure), and is not limited herein. In some embodiments, the spacer layer 164 is for a purpose of compensation of the spacers 154, which may be partially removed during the exposure of the source/drain structures 13. In some embodiments, the spacer layer 164 surrounds or covers the mask layer, which includes remaining portions of the capping layer 162 and the dielectric layer 163 and remaining portions of the dielectric layer 161. In some embodiments, the spacer layer 164 and the remaining portions of the capping layer 162 and the dielectric layer 163 are collectively referred to as an insulating structure 16 surrounding or covering the gate structures 15. In some embodiments, the insulating structure 16 also includes portions of the dielectric layer 161 remaining after the exposure of the source/drain structures 13. In some embodiments, the insulating structure 16 at least covers an entirety of the nanosheet structures 111. The insulating structure 16 may function as a hard mask or a protection from damage of subsequent processing to the gate structures 15. In some embodiments, the insulating structure 16 is referred to as a hard-mask structure 16 or a protecting structure 16.

Referring to FIG. 8, an epitaxial growth is performed in the operation 603 and/or the operation 704. In some embodiments, a semiconductive material layer 17 is formed conformally over the insulating structure 16 and the source/drain structures 13. In some embodiments, a deposition with processing gases of silicon (e.g., disilane) and phosphorous (e.g., phosphane) is performed to form the semiconductive material layer 17. In some embodiments, the deposition is a non-selective deposition.

A first portion 171 of the semiconductive material layer 17 over the source/drain structures 13 becomes crystalline semiconductive material and a second portion 172 of the semiconductive layer 17 over the insulating structure 16 becomes amorphous semiconductive material due to a property of epitaxial growth of a semiconductive material. In some embodiments, the source/drain structure 13 is referred to as a first epitaxial structure or a first crystalline structure, and the first portion 171 of the semiconductive material layer 17 is referred to as a second epitaxial structure or a second crystalline structure. In some embodiments, the first portion 171 of the semiconductive material layer 17 contacts the top surfaces of the source/drain structures 13. In some embodiments, the first portion 171 of the semiconductive material layer 17 surrounds a bottom portion of the spacer layer 164 above the source/drain structures 13. In some embodiments, a growth rate of the second portion 172 of the semiconductive material layer 17 is substantially less than a growth rate of the first portion 171 due to a property of the material. In some embodiments, a thickness of the first portion 171 of the semiconductive material layer 17 is substantially less than a thickness of the second portion 172.

Figure 9:
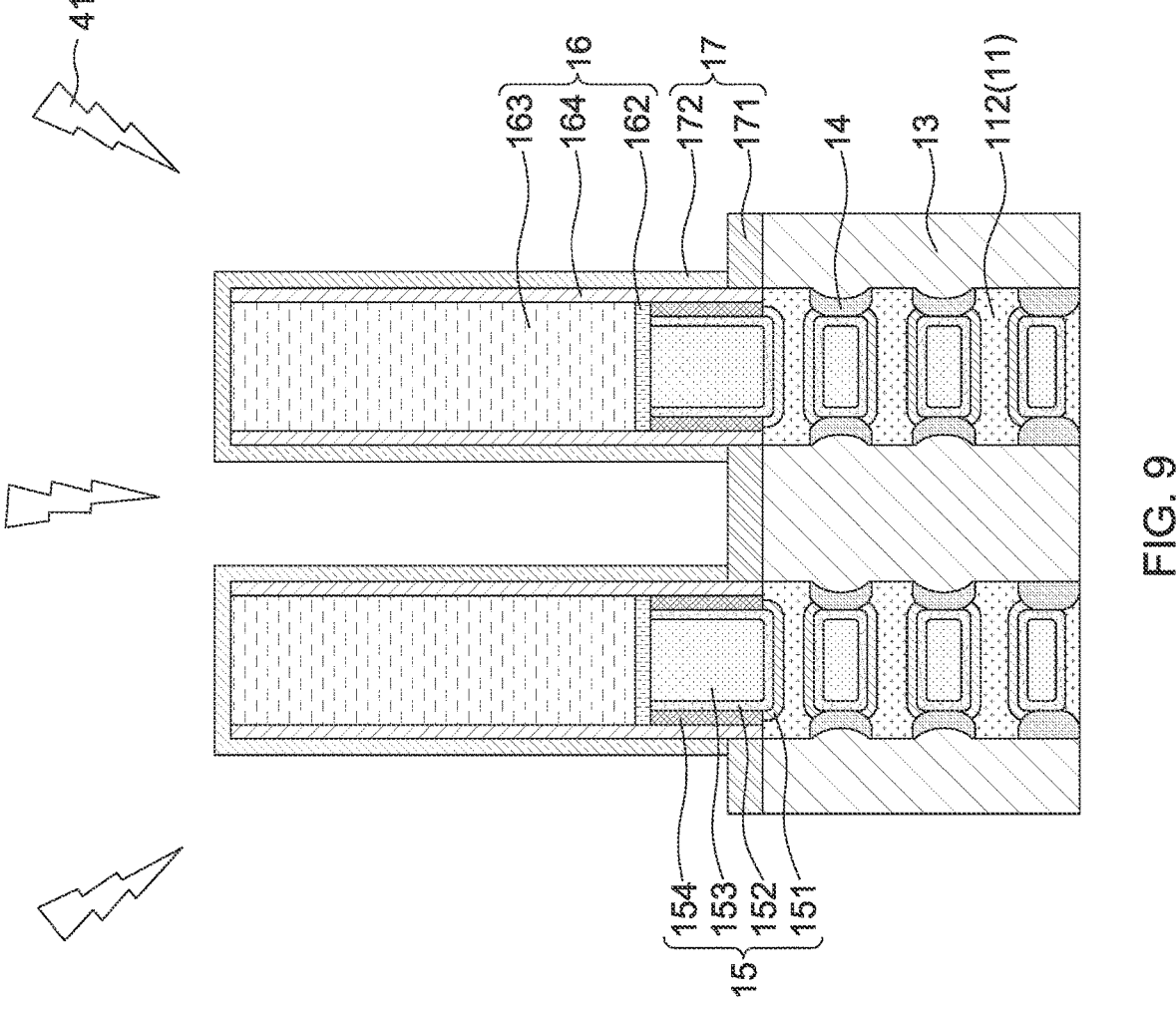

Referring to FIG. 9, the semiconductive material layer 17 is exposed to a radiation 41 prior to the operation 604 and/or the operation 705. In some embodiments, a frequency of the radiation 41 is in a range of 1 to 10 gigahertz (GHz). In some embodiments, a wavelength of the radiation 41 is in a range of 0.3 to 0.03 meters (m). In some embodiments, the radiation 41 is a microwave or a millimeter wave. The radiation is for a purpose of heating of the semiconductive material layer 17, and the frequency of the radiation can be adjusted to a frequency specific to the material of the semiconductive material layer 17 in order to optimize heating efficiency.

In reference to an operation of a microwave oven, a dielectric constant and a dielectric loss factor are two factors of a loss tangent of a material, and a range of frequencies of radiation can be acquired according to a variation of the loss tangents of the material. Thus, heating efficiency can be improved if a radiation having a frequency within the range of frequencies is provided to the material. Similarly, the heating efficiency can be optimized if a radiation having a frequency corresponding to a maximum of the variation of the loss tangents is provided to the material. For example, the semiconductive material layer 17 is composed of doped silicon, and a frequency of the radiation 41 is in a range of 1.2 to 4.2 gigahertz (GHz). In some embodiments, the semiconductive material layer 17 is heated to a temperature substantially greater than a temperature of materials other than silicon under the exposure of the radiation 41. In some embodiments, a temperature of the second portion 172 of the semiconductive material layer 17 is substantially greater than a temperature of the first portion 171 after the exposure because a thermal conductivity of the substrate layer 11 is greater than a thermal conductivity of the insulating structure 16. In some embodiments, the temperature of the second portion 172 is in a range 400 to 440° C., and the temperature of the first portion 171 is in a range 370 to 400° C.

In some embodiments, a detection or a measurement of the temperature of the second portion 172 of the semiconductive material layer 17 is performed after the semiconductive material layer 17 is exposed to the radiation 41 for a certain duration of time. In some embodiments, a fluorescence thermometer is used for an off-line temperature measurement in a high frequency environment. In some embodiments, the method 600 and/or the method 700 moves to a next operation when a default temperature of the second portion 172 is detected or a target difference between the temperatures of the first portion 171 and the second portion 172 is detected.

Figure 10:
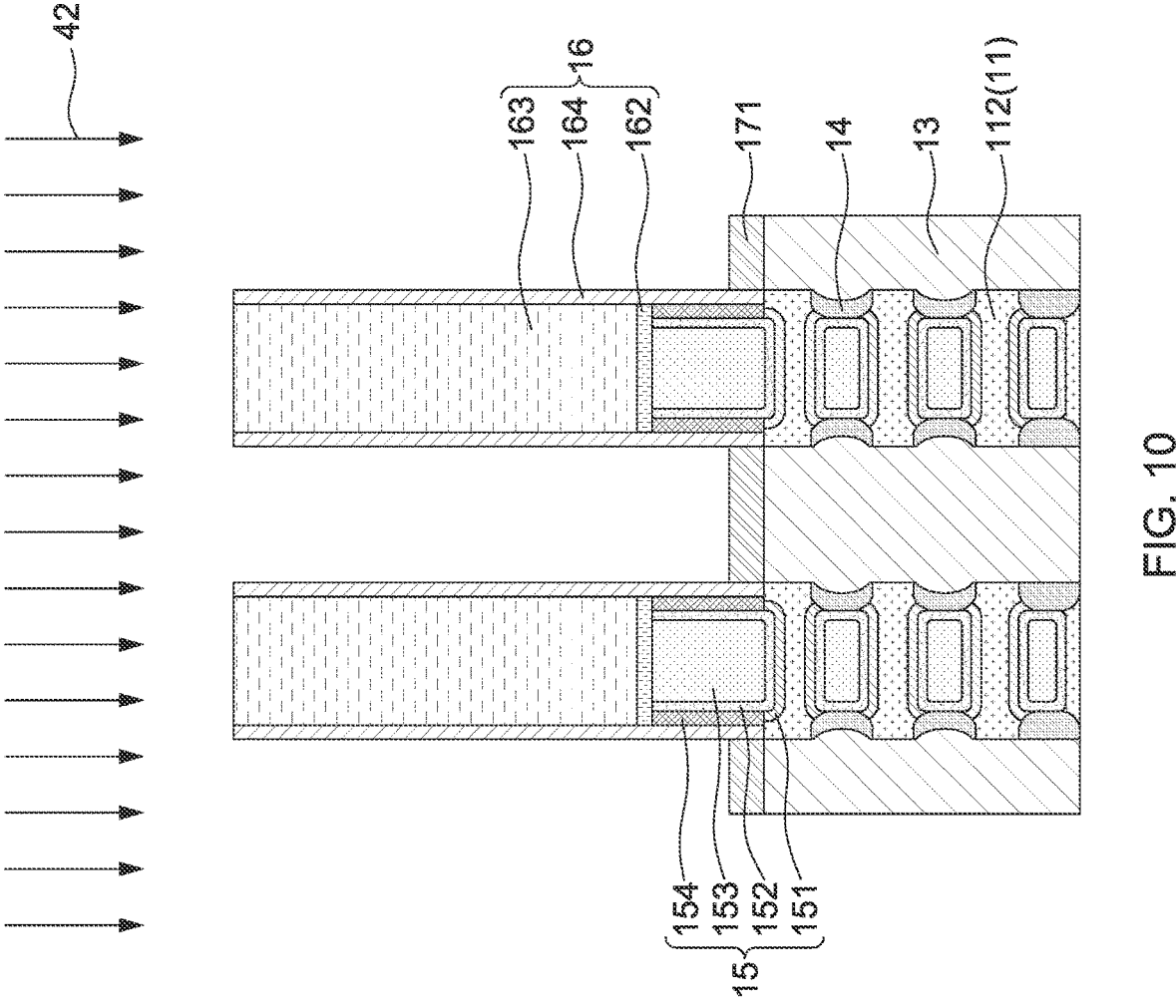

Referring to FIG. 10, the second portion 172 of the semiconductive material layer 17 is removed in the operation 604 and/or the operation 706. In some embodiments, an etching-back operation 42 is performed on the second portion 172 of the semiconductive material layer 17. In some embodiments, some of the first portion 171 of the semiconductive material layer 17 is also removed by the etching-back operation 42 since the two portions 171 and 172 include a same component. However, a removal rate of the etching-back operation 42 on the second portion 172 is greater than a removal rate on the first portion 171 due to different lattice structures and different temperatures. The higher temperature of the second portion 172 of the semiconductive material layer 17 facilitates the greater removal rate of the etching-back operation 42 on the second portion 172. Therefore, the second portion 172 can be efficiently removed.

The radiation 41 can be provided during the etching-back operation 42 to remove the second portion 172. A processing gas of the etching-back operation 42 can be excited by the radiation 41, and a reaction rate of the processing gas with the second portion 172 (having a density of dangling bonds greater than that of the first portion 171) of the semiconductive material layer 17 can be enhanced, and thus the removal of the second portion 172 of the semiconductive material layer 17 can be further improved. In other words, the excited processing gas has a kinetic energy, which can reduce an activation barrier energy of a reaction with the dragline bonds of the second portion 172 of the semiconductive material layer 17, and thus a removal rate of the etching-back operation 42 on the second portion 172 can be enhanced. In some embodiments, the processing gas of the etching-back operation 42 includes hydrogen chloride, chlorine, or a combination thereof.

Figure 11:
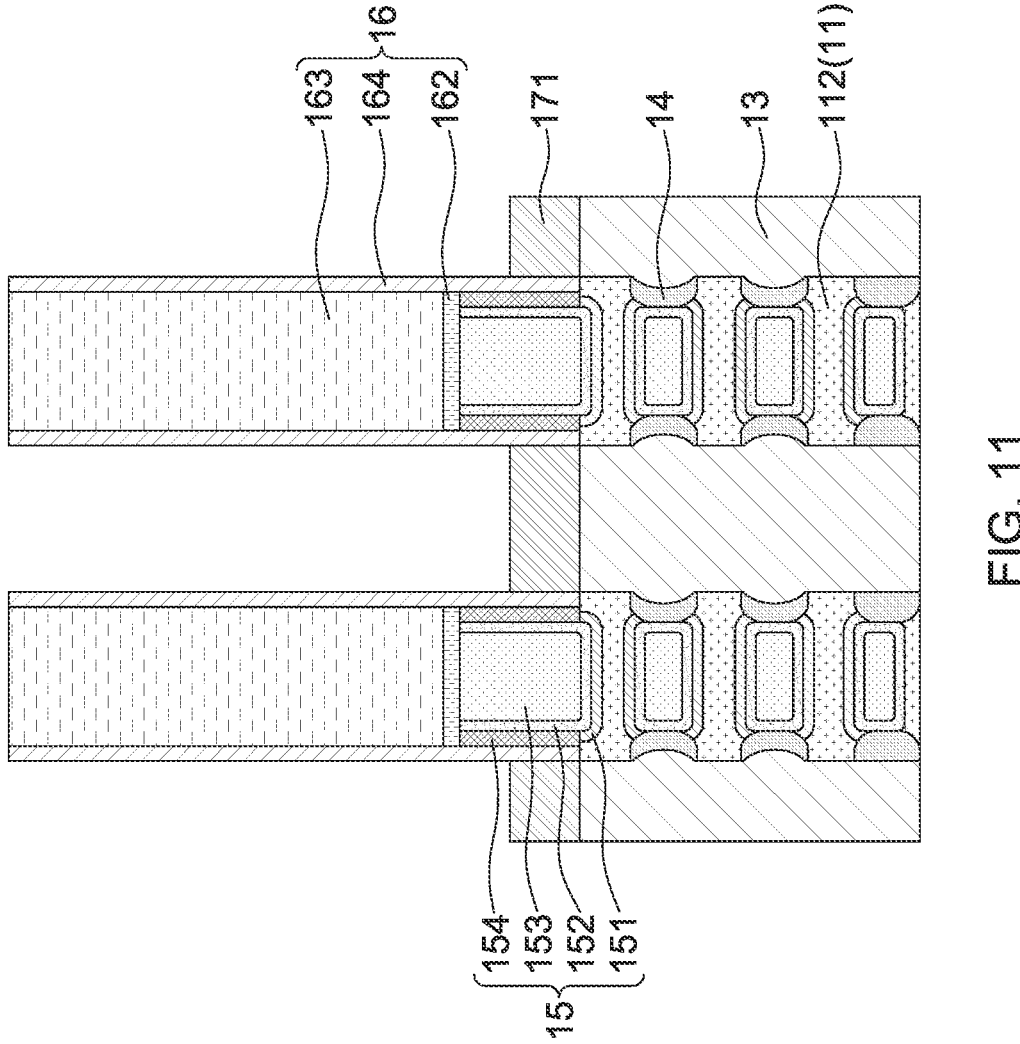

Referring to FIG. 11, the operations as depicted in FIGS. 8 to 10 are repeated until the first portion 171 reaches a desired thickness. In some embodiments, the thickness of the first portion 171 at the stage shown in FIG. 11 is in a range of 7 to 15 nm. In some embodiments, the first portion 171 is grown with a chemical doping concentration in a range of 1E21 to 3E21 atoms/cm$^3$. For a purpose of illustration, the first portion 171 is hereinafter referred to as an epitaxial structure 171. In some embodiments, a bottom portion of the spacer layer 164 is surrounded by the epitaxial structure 171, and a remaining portion of the spacer layer 164 is exposed. In some embodiments, a top surface of the epitaxial structure 171 is lower than the top surface of the gate structure 15.

Subsequently, a dopant activation can be performed on the source/drain structures 13 and the first portion 171. In some embodiments, the dopant activation includes an irradiation of the source/drain structures 13 and the first portion 171 by the radiation 41. In some embodiments, the operations depicted in FIGS. 8 to 11 and the dopant activation are performed in a same processing chamber. In some embodiments, the radiation 41 is provided until the end of the dopant activation. In some embodiments, the processing gas(es) is(are) delivered into the processing chamber during the etching-back operation 42 of the removal of the second portion 172 as described above. In some embodiments, an entire formation of the epitaxial structure 171 is kept at a temperature in a range of 300 to 500° C.

A doping concentration of the epitaxial structure 171 can be substantially greater than a doping concentration of the source/drain structure 13 at the stage shown in FIG. 11. In some embodiments, the doping concentration of the epitaxial structure 171 after the dopant activation is in a range of 1E21 to 2E21 atoms/cm³. In some embodiments, the doping concentration of the source/drain structures 13 after the dopant activation is in a range of 2E20 to 5E20 atoms/cm³. The doping concentration of the epitaxial structure 171 being greater than that of the source/drain structures 13 provides an advantage of reducing an electrical resistance during the operation. In some embodiments, the epitaxial structure 171 is considered as a part of a source/drain structure. In some embodiments, the epitaxial structure 171 is referred to as an upper portion 171 of a source/drain structure, and the source/drain structure 13 shown in the figures is referred to as a lower portion 13 of the source/drain structure.

Referring to FIG. 12, a silicidation is performed on the epitaxial structure 171. In some embodiments, a surficial portion of the epitaxial structure 171 is transformed into a silicide layer 181. In some embodiments, a thickness of the silicide layer 181 is in a range of 5 to 9 nm. In some embodiments, the silicide layer 181 surrounds a portion of the spacer layer 164. In some embodiments, the silicide layer 181 contacts the portion of the spacer layer 164. A conventional silicide formation can be applied, and is not limited herein.

Figure 13:
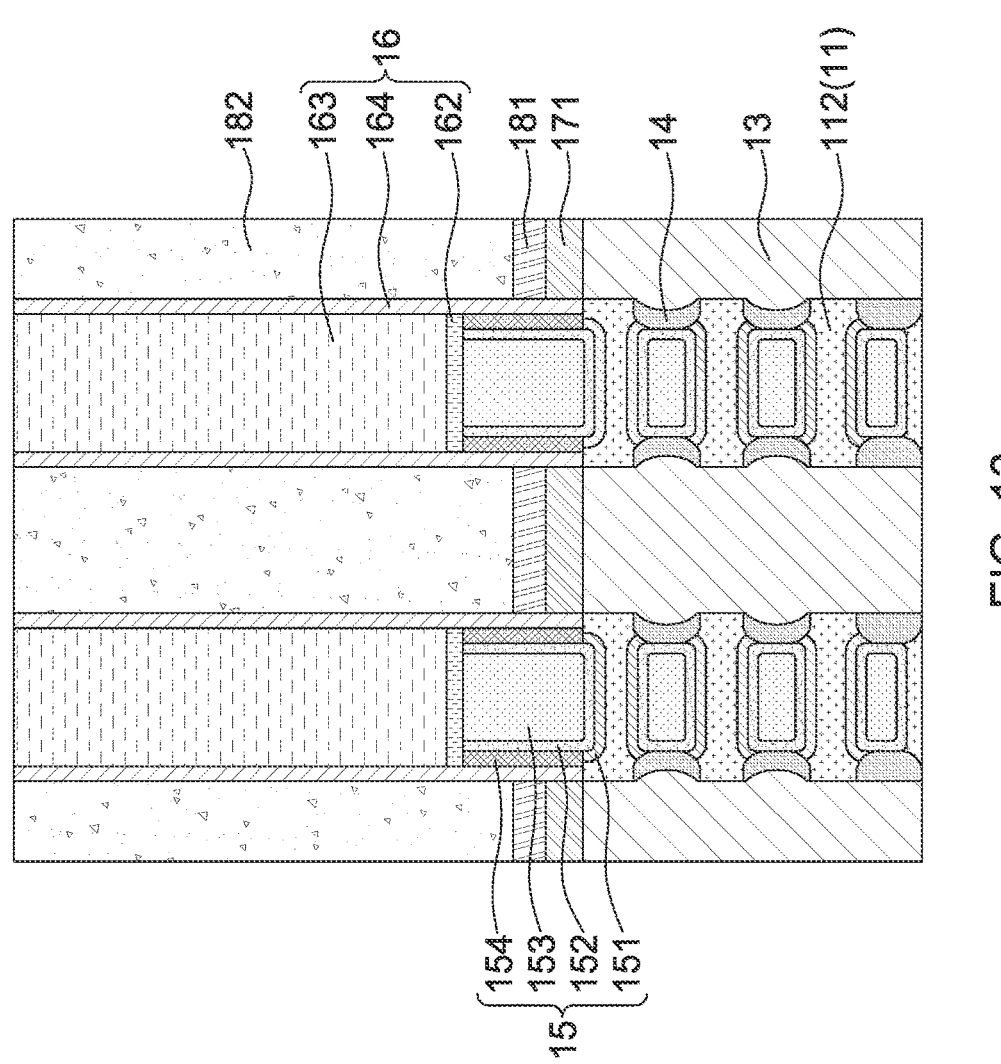

Referring to FIG. 13, a plurality of conductive plugs 182 are formed to electrically connect to the source/drain structures 13 through the silicide layer 181, and a semiconductor structure 200 is thereby formed. In some embodiments, a deposition of a conductive material or a metallic material is performed followed by an etching-back operation. The conductive plug 182 can be a single-layer structure or a multi-layer structure. In some embodiments, the conductive plugs 182 include copper (Cu), aluminum (Al), tungsten (W), manganese (Mn), cobalt (Co), titanium (Ti), tantalum (Ta), titanium nitride (TiN), tantalum nitride (TaN), other suitable composite metals, or a combination thereof. In some embodiments, a top surface of the conductive plug 182 is substantially aligned with a top surface of the insulating structure 16. In some embodiments, the top surface of the conductive plug 182 is substantially coplanar with the top surface of the insulating structure 16. The doping concentration of the epitaxial structure 171 remains greater than that of the source/drain structure 13 at the stage shown in FIG. 13.

A conventional source/drain structure is formed prior to a formation of a gate structure at beginning stages of a manufacturing process of a semiconductor. A processing temperature of the beginning stages of the manufacturing process (i.e., front end of line (FEOL)) of a semiconductor is around or above 800° C., which is a relatively high temperature compared to processing temperatures of a back end of line (BEOL) or a middle end of line (MEOL) of a semiconductor. Degradation of a quality of a source/drain structure and reduction of a doping concentration of a source/drain structure become issues due to a high thermal budget of FEOL. As technology improves and scales are reduced, such issues cause a bottleneck in the manufacturing process.

To address the above issues, the present disclosure provides a semiconductor structure and a method for forming the same. The semiconductor structure includes an epitaxial structure formed after FEOL or after formation of a metal gate structure. Although the original source/drain structure formed in FEOL and the epitaxial structure formed in MEOL or BEOL are formed with substantially equal doping concentrations, their doping concentrations after a dopant activation are different since the original source/drain structure has undergone operations in FEOL with higher thermal budgets. Therefore, the epitaxial structure of the present disclosure can be considered as a part of a source/drain structure and also provide a reduced contact resistance compared to a conventional source/drain structure.

Figure 14:
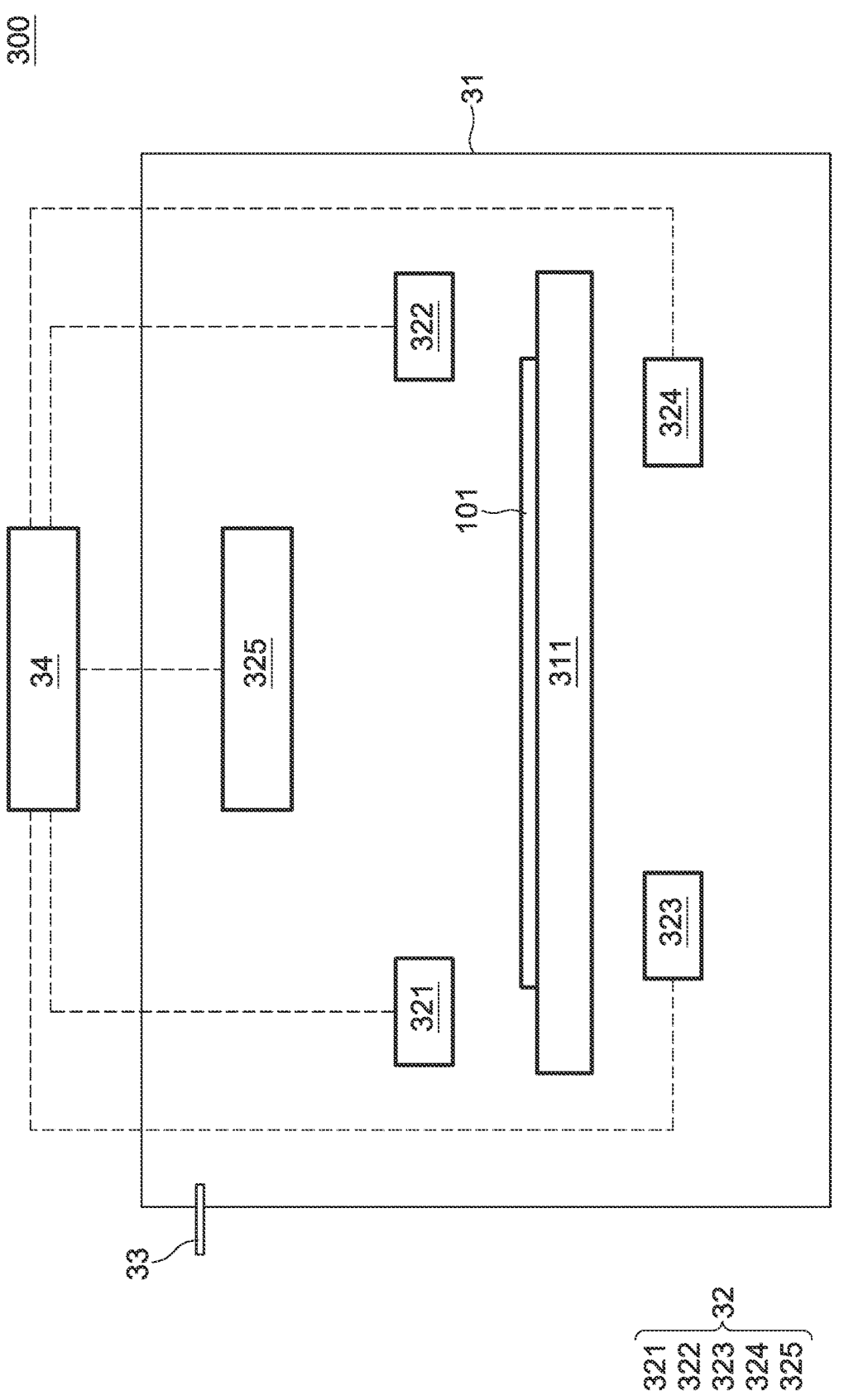
FIG. 14 is a schematic diagram of an apparatus for performing operations in the manufacture of a semiconductor structure in accordance with some embodiments of the present disclosure.

FIG. 14 is a schematic diagram of an apparatus 300 for performing at least the operations depicted in FIGS. 8 to 11 in accordance with some embodiments of the present disclosure. In some embodiments, the apparatus 300 includes a chamber 31, a stage 311 in the chamber 31, a plurality of radiation sources 32 disposed above and/or below the stage 311 in the chamber 31, and a conduit 33 disposed on at least a sidewall of the chamber 31.

A semiconductor structure 101 is disposed on the stage 311 prior to and during the operations depicted in FIGS. 8 to 11. In some embodiments, the semiconductor structure 101 is similar to that shown in FIG. 7. In some embodiments, the stage 311 provides a rotational movement of the semiconductor structure 101 during the operations. The radiation sources 32 include at least one beamforming antenna. In some embodiments, the radiation sources 32 further include a lamp and/or a laser source. For example, the radiation sources 32 include radiation sources 321 to 325 disposed at different positions relative to the semiconductor structure 101. In some embodiments, the radiation sources 321 and 322 are disposed above the stage 311 toward different regions of the semiconductor structure 101. In some embodiments, the radiation sources 321 and 322 are laser sources for a purpose of local heating of the semiconductor structure 101. In some embodiments, the radiation sources 321 and 322 are disposed below the stage 311 toward different regions of the semiconductor structure 101. In some embodiments, the radiation sources 323 and 324 are lamps for a purpose of general heating across the semiconductor structure 101. In some embodiments, the radiation source 325 is disposed above the stage 311 over a central region of the semiconductor structure 101 during the operations. In some embodiments, the radiation source 325 is a beamforming antenna for a purpose of local heating specific to a certain material of the semiconductor structure 101. One or more types of radiation sources can be used, and a number of types of radiation sources can be adjusted according to different applications.

Each of the radiation sources 32 is electrically connected to a controller 34. In some embodiments, the controller 34 includes a central processing unit. The controller 34 can control operation of each of the radiation sources 32. In some embodiments, a frequency of radiation generated by the radiation source 325 (or one or more beamforming antennas of the radiation sources 32) is controlled by the controller 34. In some embodiments, the controller 34 includes a power amplifier, a transmit-receive (T/R) switch, a phase shifter, an attenuator, a power divider, a phase array circuit, other electrical elements for desired functions, or a combination thereof. In some embodiments, the radiation generated by the radiation source 325 is a microwave or a millimeter wave radiation.

The conduit 33 penetrates through one or more sidewalls of the chamber 31. It should be noted that only one conduit 33 is shown in FIG. 14 for a purpose of illustration but is not intended to limit the present disclosure. One or more processing gases are injected into the chamber 31 through the conduit 33 during the operations depicted in FIG. 10. In some embodiments, the conduit 33 is connected to a chemical source (not shown) for supplying the processing gases.

In accordance with some embodiments of the present disclosure, a method of manufacturing a semiconductor structure is provided. The method may include several operations. A substrate is provided, received or formed, wherein the substrate includes an epitaxial structure in a fin structure of the substrate and a metal gate structure over the fin structure. An insulating layer covering the metal gate structure is formed. A semiconductive material layer is formed over the epitaxial structure and the insulating layer, wherein a first portion of the semiconductive material layer over the epitaxial structure comprises crystalline semiconductive material, and a second portion of the semiconductive material layer over the insulating layer comprises amorphous semiconductive material. The second portion of the semiconductive material layer is removed.

In accordance with some embodiments of the present disclosure, a method of manufacturing a semiconductor structure is provided. The method may include several operations. A substrate, including a first epitaxial structure in a fin structure of the substrate and a metal gate structure over the fin structure, is received, provided or formed. An insulating layer is formed above the metal gate structure. A dielectric layer is formed surrounding the insulating layer and the metal gate structure above the first epitaxial structure. A second epitaxial structure is formed surrounding a bottom portion of the dielectric layer, and an amorphous layer is formed surrounding an upper portion of the dielectric layer. The amorphous layer is exposed to a radiation, wherein a frequency of the radiation is adjusted according to a material of the amorphous layer. The amorphous layer is removed.

In accordance with some embodiments of the present disclosure, a semiconductor structure is provided. The semiconductor structure includes a substrate, including a metal gate structure surrounding a portion of the substrate, and a source/drain structure disposed adjacent to the metal gate structure; a mask layer, disposed over the metal gate structure; and a dielectric layer, surrounding the mask layer and a portion of the metal gate structure, wherein a lower portion of the source/drain structure is below the dielectric layer, and an upper portion of the source/drain structure surrounds a portion of the dielectric layer.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a substrate, including an epitaxial structure in a fin structure of the substrate and a metal gate structure over the fin structure;
   forming an insulating structure covering the metal gate structure, comprising:
      forming a capping layer over the substrate;
      forming a dielectric layer over the capping layer; and
      removing a portion of the dielectric layer and a portion of the capping layer over the epitaxial structure;
   forming a semiconductive material layer over the epitaxial structure and the insulating structure, wherein a first portion of the semiconductive material layer over the epitaxial structure comprises crystalline semiconductive material, and a second portion of the semiconductive material layer over the insulating structure comprises amorphous semiconductive material; and
   removing the second portion of the semiconductive material layer.

2. The method of claim 1, further comprising:
   exposing the semiconductive material layer to radiation prior to the removal of the second portion of the semiconductive material layer, wherein a frequency of the radiation depends on a material of the semiconductive material layer.

3. The method of claim 1, further comprising:
   exposing a processing gas to radiation to exciting the processing gas prior to the removal of the second portion of the semiconductive material layer.

4. The method of claim 1, wherein the formation of the insulating structure further comprises:
   forming a spacer layer surrounding remaining portions of the dielectric layer and the capping layer and a portion of the metal gate structure above the epitaxial structure.

5. The method of claim 1, wherein a surficial part of the first portion of the semiconductive material layer is removed concurrently with the removal of the second portion.

6. The method of claim 1, further comprising:
   exposing the first portion of the semiconductive material layer to radiation after the removal of the second portion of the semiconductive material layer, wherein a frequency of the radiation depends on a material of the semiconductive material layer.

7. The method of claim 1, further comprising:
   forming a silicide layer over the first portion of the semiconductive material layer.

8. The method of claim 1, further comprising:
   forming a conductive plug over the first portion of the semiconductive material layer.

9. The method of claim 2, wherein the frequency of the radiation is 1.2 to 4.2 gigahertz (GHz).

10. The method of claim 2, wherein a temperature of the second portion of the semiconductive material is greater than a temperature of the first portion of the semiconductive material after exposing the semiconductive material layer to radiation.

11. The method of claim 10, wherein the temperature of the second portion of the semiconductive material is in a range 400 to 440° C., and the temperature of the first portion is in a range 370 to 400° C.

12. The method of claim 5, wherein a removal rate of the second portion of the semiconductive material is substantially greater than a removal rate of the first portion of the semiconductive material.

13. The method of claim 3, wherein the processing gas includes hydrogen chloride, chlorine, or a combination thereof.

14. The method of claim 1, wherein the first portion of the semiconductive material layer is grown with a chemical doping concentration in a range of 1E21 to 3E21 atoms/cm$^3$.

15. The method of claim 1, wherein a thickness of the first portion of the semiconductive material layer is in a range of 7 to 15 nm.

16. The method of claim 7, wherein a thickness of the silicide layer is in a range of 5 to 9 nm.

17. The method of claim 8, wherein a top surface of the conductive plug is aligned with a top surface of the insulating structure.

18. The method of claim 1, wherein the capping layer covers an entirety of the metal gate structure.

19. The method of claim 1, wherein the capping layer includes a dielectric material different from a dielectric material of the dielectric layer.

20. The method of claim 7, further comprising forming a conductive plug over the silicide layer.

\* \* \* \* \*